United States Patent
Nag et al.

(10) Patent No.: US 6,297,125 B1
(45) Date of Patent: *Oct. 2, 2001

(54) AIR-BRIDGE INTEGRATION SCHEME FOR REDUCING INTERCONNECT DELAY

(75) Inventors: Somnath S. Nag, Saratoga, CA (US); Amitava Chatterjee; Girish A. Dixit, both of Plano, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,252

(22) Filed: Jan. 19, 1999

Related U.S. Application Data

(60) Provisional application No. 60/072,402, filed on Jan. 23, 1998.

(51) Int. Cl.$^7$ ................................................. H01L 21/76
(52) U.S. Cl. .......................... 438/421; 438/422; 438/622; 257/522; 257/758
(58) Field of Search .................................. 438/421, 422, 438/FOR 224, FOR 225, 411, 412, 319, 622; 257/758, 522

(56) References Cited

U.S. PATENT DOCUMENTS

| | | | |
|---|---|---|---|
| 5,324,683 | * | 6/1994 | Fitch et al. ............................ 438/422 |
| 5,549,934 | * | 8/1996 | Garza et al. ........................... 427/489 |
| 5,665,849 | * | 9/1997 | Cho ....................................... 528/31 |
| 5,728,631 | * | 3/1998 | Wang .................................... 438/787 |
| 5,880,018 | * | 3/1999 | Boeck et al. .......................... 438/619 |
| 5,949,143 | * | 9/1999 | Bang ..................................... 257/758 |
| 6,037,249 | * | 3/2000 | Chiang et al. ........................ 438/619 |
| 6,043,147 | * | 3/2000 | Chen et al. ........................... 438/624 |
| 6,083,850 | * | 7/2000 | Shields ................................. 438/763 |

OTHER PUBLICATIONS

Tsai, et al., "Multiple Arbitrary Shape Via Hole and Air–Bridge Transitions in Multilayered Structures", Dec. 1996 IEEE Transactions on Microwave Theory and Techniques, vol. 44, No. 12, pp. 2504–2511.

Goldfarb, et al., "The Effect of Air Bridge Height on the Propagation Characteristics of Microstrip", Oct. 1991 IEEE Microwave and Guided Wave Letters, vol. 1, No. 10, pp. 273–274.

Villeneuve, et al., "Air–Bridge Microcavities", 1995 American Institute of Physics, Appl. Phys. Lett. 67(2), Jul. 10, 1995, pp. 167–169.

Fleming, et al., "Use of Air Gap Structures to Lower Intralevel Capacitance", U.S. Department Commerce National Technical Information Service 1997.

* cited by examiner

*Primary Examiner*—Eddie Lee
*Assistant Examiner*—José R. Diaz
(74) *Attorney, Agent, or Firm*—Jacqueline J. Garner; W. James Brady, III; Frederick J. Telecky, Jr.

(57) ABSTRACT

Air-bridges are formed at controlled lateral separations using the extremely high HF etch rate of a gap-fill spin-on-glass such as uncured hydrogen silsequioxane (HSQ) in combination with other dielectrics having a much slower etch rate in HF. The advantages of an air-bridge system with controlled lateral separations include providing an interconnect isolation dielectric which meets all requirements for sub-0.5 micron technologies and providing a device with reduced reliability problems.

9 Claims, 2 Drawing Sheets

AIR-BRIDGE INTEGRATION SCHEME FOR REDUCING INTERCONNECT DELAY

This application claims priority under 35 USC §119(e)(1) of provisional application Ser. No. 60/072,402, filed Jan. 23, 1998.

BACKGROUND AND SUMMARY OF THE INVENTION

The present invention relates to integrated circuit structures and fabrication methods.

Background: Circuit Delay

The majority of the circuit delay for sub-0.5 micron gate-length integrated circuits is the delay of the interconnects. Both low inter-level and low inter-line capacitance are important to alleviating this problem, but it has become increasingly important to reduce the inter-line capacitance which dominates at less than 0.8 micron. This is recognized as being a major unresolved challenge to the semiconductor industry.

Parasitic capacitance between conductors hurts device performance, since the capacitive load on the wiring slows down the propagation of signals. Dielectrics with a low dielectric constant k are used around the interconnects because these low-k dielectrics allow little leakage current, as well as decreasing the parasitic capacitance. Current low-k dielectrics which may be used for interconnect isolation include fluorinated silicon dioxide, polymers, spin-on glasses (SOGs), and xerogels, with specific examples being hydrogen-silsequioxane (HSQ, k=2.8), parylene (k=2.4) and acrogel (k=1.7).

For sub-0.5 micron nodes, however, other requirements are needed in addition to a low dielectric constant. It is required that a dielectric also have mechanical strength, dimensional stability, ease of pattern and etch, compatibility with chemical-mechanical polishing, good adhesion to metals and oxides, good thermal conductivity, low moisture absorption, high thermal stability, no film shrinkage, electrically robust, and good gap-fill. The current low-k dielectrics either do not meet, or only marginally meet, these additional requirements. Furthermore, these current low-k dielectrics pose many integration, reliability, and manufacturability problems.

Background: Air-Bridge Structures

The most effective way to reduce interconnect capacitance, and thereby RC delay, is the use of air, which has a dielectric constant of 1, between the interconnects. The formation of large voids between the metal interconnects, called air-bridges, are discussed, for example, in the following references, all of which are hereby incorporated by reference: Ta et al., "Multiple Arbitrary Shape Via-Hole and Air-Bridge Transitions in Multilayered Structures," 1996 IEEE MTT-S INTERNATIONAL MICROWAVE SYMPOSIUM DIGEST vol. 2, pp.707–710 (1996); Villeneuve et al., "Air-Bridge Microcavities", APPLIED PHYSICS LETTERS, vol. 67, no. 2, pp. 167–169 (Jul. 10, 1995); and Goldfarb et al., "The Effect of Air Bridge Height on the Propagating Characteristics of Microstrip," 1 IEEE MICROWAVE AND GUIDED WAVE LETTERS 273 (October 1991). Another method of forming voids is discussed in a pending provisional application of the same assignee, "A Process Scheme to Form Controlled Airgaps Between Interconnect Lines to Reduce Capacitance", filed May 5, 1997, which received application Ser. No. 60/045,626, and which is hereby incorporated by reference.

A further method for forming air-bridges is disclosed in the article "Use of Air Gap Structures to Lower Intralevel Capacitance" J. G. Fleming et al., PROCEEDINGS OF THE DIELECTRIC FOR ULSI METAL INTERCONNECT CONFERENCE (DUMIC), 1997, February 10–11, p 139–146, which is hereby incorporated by reference. The Fleming article discusses the use of a highly non-conformal dielectric deposited over the metal interconnects. The voids formed in this way can trap chemicals during subsequent processing. To avoid this problem, a layer of hydrogen-silsequioxane (HSQ), a spin-on dielectric, is deposited over the non-conformal dielectric to fill any voids or reentrant features. This HSG layer is then capped by an oxide, which is then planarized. This is expected to give an effective dielectric constant of 1.9.

Air-Bridge Integration Scheme for Reducing Interconnect Delay

The present application discloses a technique to form air-bridges at controlled lateral separations. Such air-bridges are formed using the extremely high HF etch rate of a gap-fill spin-on-glass such as uncured hydrogen-silsequioxane (HSQ) which has an estimated etch rates in HF over 50 times that of thermal oxide. First, the connect lines are protected by a thin layer of a dielectric, such as a high quality silicon dioxide. HSQ is deposited between the interconnect lines, but not cured, and overlain with another dielectric which has a much lower etch rate in HF, such as silicon dioxide. Holes are etched through the upper dielectric layer into the HSQ layer, followed by an HF etch to remove the HSQ, leaving air pockets between the interconnect lines.

The advantages of the disclosed air-bridge integration system include:

- meets all dielectric requirements for sub-0.5 micron technologies listed above;
- creation of voids is independent of metal spacing (narrow or wide);
- a large fraction of the inter-metal spacing is used to form the void;
- dielectric seam/pinch-off is more controlled due to the uniform dimension of slots; and
- reliability problems are prevented by the high-quality silicon dioxide formed on the metal-line sidewalls.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Air-bridge Structure with Reduced Interconnect Delay

Figure 1:
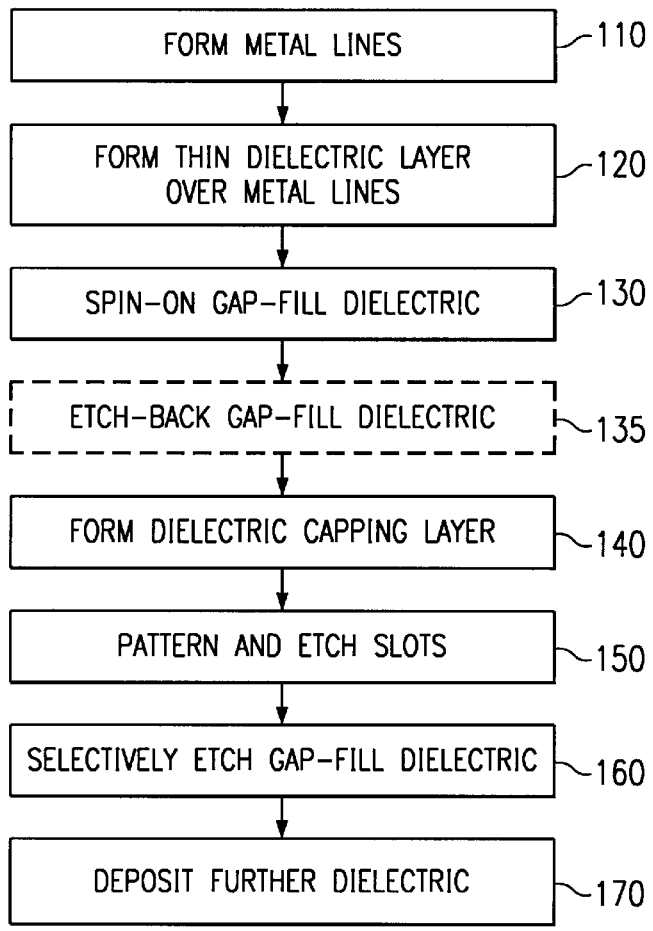
FIG. 1 shows a process flow for fabricating an air-bridge structure with reduced interconnect delay.

FIG. 1 is a process-flow for forming an air-bridge structure with reduced interconnect delay, and will now be discussed in an overview of the disclosed invention, with references to FIGS. 2–3. Details of the structures in FIGS. 2 and 3 as well as specific examples are discussed below in a sample embodiment.

Figure 2:
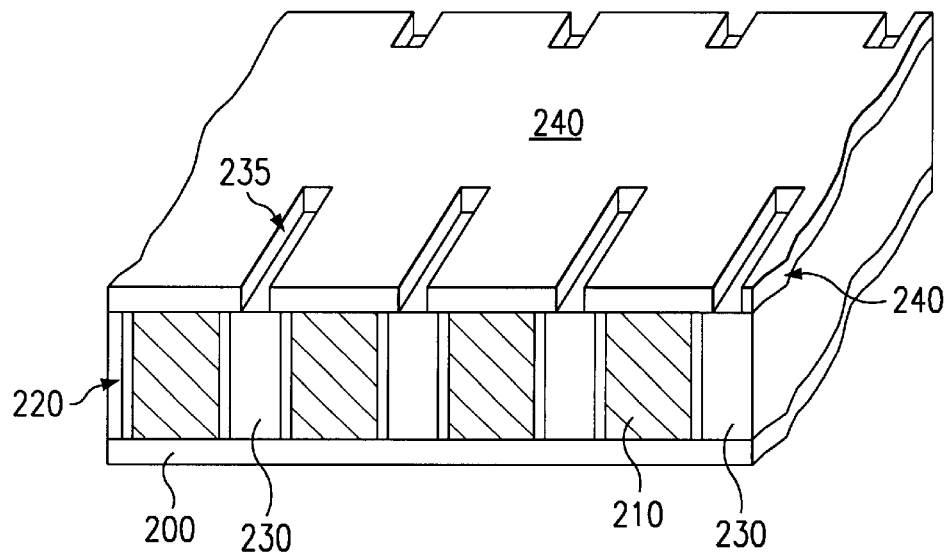
FIG. 2 shows a cut-away view of a partially formed air-bridge structure formed according to the process flow of FIG. 1.
Figure 3:
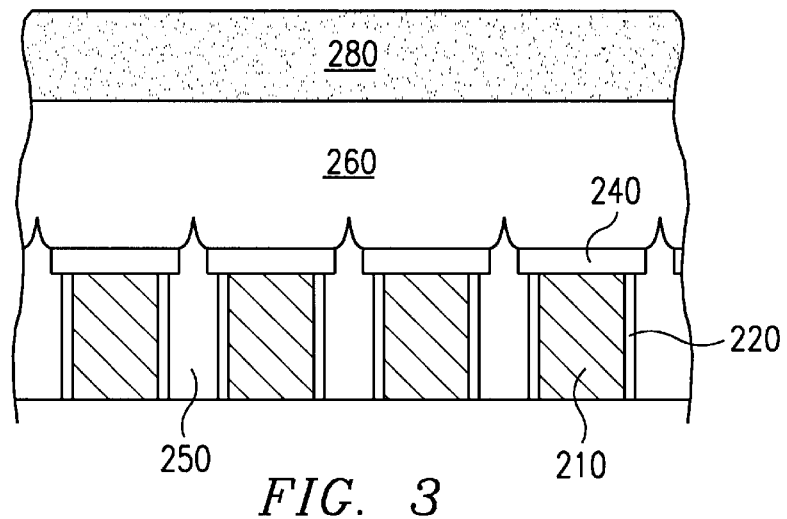
FIG. 3 shows a cross-sectional view of a completed air-bridge structure formed according to the disclosed process flow.

FIG. 2 shows a structure with metal lines 210, which are formed (step 110) in a conventional method, over a partially fabricated integrated circuit structure over interlevel dielectric layer 200. A thin dielectric layer 220 is deposited over the metal lines to protect the metal from contamination or damage during further processing (step 120). Next, gap-fill dielectric 230 is spun-on to fill the spaces between the metals lines 210. A standard hot plate bake is performed, but the gap-fill dielectric is not cured in a furnace, and consequently, conversion to silicon dioxide does not occur (step 130).

A capping dielectric layer 240 is then deposited (step 140) over gap-fill dielectric 230 and metal lines 210, completely covering these two layers. Slots 235 are patterned and etched in top dielectric layer 240 such each slot is contained entirely within the inter-metal spacing (step 150), providing access to the gap-fill dielectric 230.

Gap-fill dielectric 230 is then selectively and rapidly etched from inside the metal space through the slots (step 160). This leaves a cavity 250 under the top dielectric layer 240, as shown in FIG. 3.

A further dielectric layer 260 is then deposited (step 170) over the dielectric layer 240. Dielectric 260 is deposited in manner such that it will have poor gap-filling qualities. This results in a structure where the metal lines 210 are encapsulated in thin dielectric layer 220 on the sidewalls, while thicker inter-level dielectric layers 200, 240 and 260 enclose the top and bottom of the metal lines/air-bridge structure. Since inter-level dielectric layer 260 has poor gap-filling qualities for sub 0.5 micron, it pinches off above slots 235, thus leaving air-gaps 250 in the metal spaces. Remaining integration, including formation of subsequent metal layers, is completed according to conventional methods.

First Embodiment

In this embodiment, aluminum lines 210 are formed over interlevel dielectric layer 200, which is deposited from tetraethylorthosilicate (TEOS) by a conventional plasma-enhanced deposition method. The resulting oxide is known as a PETEOS (Plasma-Enhanced TEOS) oxide.

A thin, (e.g., 50–100 nanometers) dielectric layer 220 is deposited over metal lines 210, and is preferably undoped PETEOS silicon dioxide. Although the drawings depict layer 220 as a conformal layer, this is not required, as long as the sidewalls of the metal lines are covered. The deposition process below produces the typical "bread loaf" profile, and would pinch off the opening if deposition continued long enough, but only a thin layer is required for protection of the metal lines. Deposition conditions of the PETEOS oxide are as follows:

O2 Source Flow: 600–800 sccm
TEOS: 850–1050 mgm
Susceptor Spacing: 240–260 mill
Pressure: 8.2 Torr
Wafer Temperature: 390–400 degrees C.
Time: 10 sec Gap-fill dielectric 230 is preferably HSQ. The HSQ is deposited according to conventional spin-on methods at, e.g. 4000 rpm, and a multi-step hot plate bake is performed, at e.g. 100 degrees C. for 3 minutes followed by 250 degrees C. for 3 minutes, but the HSQ is not cured. Not curing the HSQ results in a faster etch rate during the later HF etch. The HSQ is preferably spun-on to barely fill the gaps, but not to form on top of the metal lines.

Capping dielectric layer 240 is deposited over the HSQ gap-fill dielectric 230 and metal lines 210. Dielectric layer 240 is a high quality oxide with a low HF etch rate, and in this sample embodiment is 200 nanometers of undoped silicon dioxide, deposited by a High-Density Plasma-Chemical-Vapor-Deposition process (HDP-CVD):

Silicon Source Flow: 30 sccm of SiH4;
Oxygen Source Flow: 57 sccm of O2;
Inert Flow: 5 sccm of Ar;
RF power: 3000 Watts;
Bias RF: 0 Watts;
Helium cooling pressure: 2000–5000 milliTorr In this sample embodiment, slots 235 are approximately 2–5 microns long, are spaced every 10–50 microns along the length of the inter-metal spacing, and are contained entirely within the inter-metal spacing. A buffered HF solution, 4.9% HF in this sample embodiment, is then used to selectively etch away the HSQ gap-fill 230 from inside the metal space. This etch will typically take 2–3 minutes. Because of the rapid etch rate of the uncured HSQ gap-fill, lateral etching of the HSQ gap-fill is possible even though the slots may be small and far apart. HF is a good choice for the etch because it will cut through some scum without attacking the metal. Selectively etching away the HSQ gap-fill leaves cavities 250 between the metal lines, as shown in FIG. 3.

Inter-level dielectric 260 is then deposited over capping dielectric layer 240. In this embodiment, inter-level dielectric 260 is PETEOS silicon dioxide, deposited with the same recipe as PETEOS layer 220, except that the deposition continues for approximately 100 seconds to produce a layer which is 500–1000 nm thick. Given the poor conformality of this layer and the controlled width of slots 235, the oxide does not go into the gap, but pinches off uniformly over slots 235. Pinching off of PETEOS oxide layer 260 completes air-gaps 260 as shown in FIG. 3. Further metal layer 280 is then formed over the PETEOS inter-level dielectric 260, and integration is completed according to conventional methods.

Figure 4A:
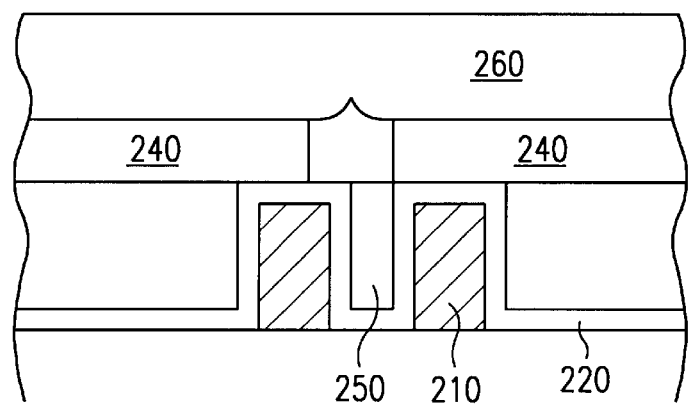
FIGS. 4A–B respectively show formation of the disclosed air-bridge in layouts with a narrow metal spacing with a misalignment and with a wide metal spacing.
Figure 4B:
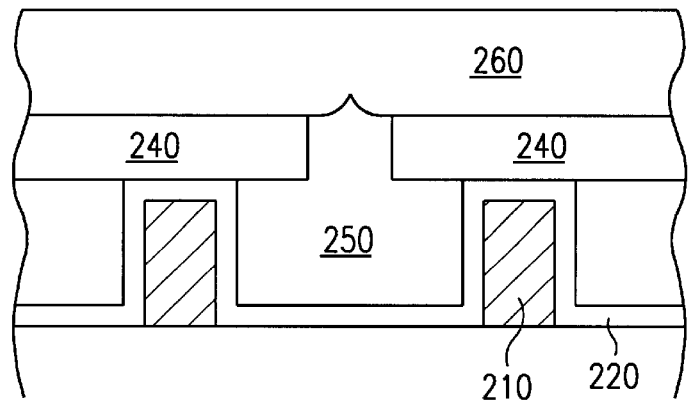

FIGS. 4A and 4B show cross-sections of two circuits in which the disclosed process has been implemented. FIG. 4A shows a circuit with narrow metal spacing. It is obvious in this figure that the slot is misaligned, yet the air-bridge is well-formed and no harm has been done to the metal line, due to the protection offered by the oxide 220 and the high selectivity of the etch. FIG. 4B shows a circuit with wide spacing between the metal lines. In this case, the controlled size of the slot combines with the poor gap-filling capabilities of layer 260 to ensure a well-formed air bridge despite the large gap. Thus the disclosed method provides an effective method for many different spacings of interconnect lines.

Second Embodiment: HDP-CVD Silicon Dioxide

Thin dielectric layer 220 is undoped HDP-CVD silicon dioxide, rather than PETEOS oxide as in the sample embodiment. Other conditions remain similar to those stated above.

Third Embodiment: HSQ Etch

An etch-back step can optionally be performed to remove any HSQ which may have formed on top of the metal lines (step 135). This can be any plasma etch for oxide, e.g., an argon sputter etch. Other conditions remain similar to those stated above.

Fourth Embodiment: Wide Intermetal Spacings

In the circuit layout of an alternate embodiment, some areas of the chip have narrow inter-metal spacings, whose capacitive linking can be significantly improved by the disclosed method, while other areas of the chip can have wider inter-metal spacings, in which the formation of air bridges is not desirable. This is especially true in those situations where the spacings are wide enough to cause structural weakness in the area of the air bridge.

In a first version of this embodiment, slots 235 will not be formed in those areas where the inter-metal spacings are wide. The HSQ will thus not be removed in these areas, so that HSQ provides structural support for the overlying layer. After the HSQ is removed from the areas having narrower spacings, an anneal will be performed to drive out any moisture in the HSQ which remains in the areas having wider spacings.

In a second version of this embodiment, dummy metal lines, which are not connected to the circuit, can be formed between the metal lines of the circuit. Slots 235 can be formed or not, as desired. The use of dummy lines will affect the capacitive coupling of the metal lines, but this is not generally a problem between widely spaced lines.

According to a disclosed class of innovative embodiments, there is provided: A fabrication method, comprising the steps of: (a.) forming a plurality of metal lines separated by lateral spaces; (b.) filling said lateral spaces between said metal lines with a first dielectric; (c.) forming a second dielectric layer over said first dielectric and said plurality of metal lines, wherein said first dielectric has a high removal rate with respect to said second dielectric; (d.) patterning and etching slots in said second dielectric layer to expose portions of said first dielectric; and (e.) selectively etching said first dielectric to substantially remove said first dielectric from said lateral spaces; whereby capacitive coupling between ones of said metal lines is reduced.

According to another disclosed class of innovative embodiments, there is provided: A fabrication method, comprising the steps of: (a.) forming a plurality of metal lines separated by lateral spaces; (b.) forming a first, substantially conformal, thin dielectric layer over ones of said metal lines; (c.) filling said lateral spaces between said metal lines with a second dielectric; (d.) forming a third dielectric layer over said second dielectric and said plurality of metal lines, wherein said second dielectric has a high removal rate with respect to said first and third dielectrics; (e.) patterning and etching slots in said third dielectric layer to expose portions of said second dielectric; (f.) selective etching said second dielectric to substantially remove said second dielectric from said lateral spaces; and (g.) forming a fourth dielectric layer over said third dielectric layer, wherein said fourth dielectric does not fill said lateral spaces; whereby capacitive coupling between ones of said metal lines is reduced.

According to another disclosed class of innovative embodiments, there is provided: An integrated circuit structure, comprising: a plurality of metal lines, ones of said metal lines being separated by respective gaps; a first dielectric layer, which is substantially conformal, directly overlying said metal lines; a second dielectric layer, having substantially planar surfaces, overlying said plurality of metal lines and said respective gaps, wherein said second dielectric layer has a plurality of through openings which open into said respective gaps; a third dielectric layer overlying said second dielectric layer, wherein said third dielectric layer covers said through openings but does not substantially extend into said gaps; wherein the dielectric constant in said gaps is approximately 1.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

What is claimed is:

1. A fabrication method, comprising the steps of:
   - (a.) forming a plurality of metal lines separated by lateral spaces;
   - (b.) filling said lateral spaces between said metal lines with a first dielectric comprising uncured hydrogen-silsequioxane;
   - (c.) forming a second dielectric layer over said first dielectric and said plurality of metal lines, wherein said first dielectric has a high removal rate with respect to said second dielectric;
   - (d.) patterning and etching slots in said second dielectric layer to expose portions of said first dielectric; and
   - (e.) selectively etching said first dielectric to substantially remove said first dielectric from said lateral spaces; whereby capacitive coupling between ones of said metal lines is reduced.

2. The method of claim 1, further comprising the step, between said step (a.) and said step (b.), of:
   - (a1.) depositing a thin liner which covers exposed portions of said plurality of metal lines.

3. The method of claim 1, wherein said second dielectric comprises plasma-enhanced tetraethylorthoslicate-derived silicon dioxide.

4. The method of claim 1, further comprising the step, after step (c.) of:
   - (c1.) selectively removing any of said first dielectric which forms on top of said metal lines.

5. The method of claim 1, further comprising the step of:
   - (f.) forming a further plurality of metal lines on said second dielectric.

6. A fabrication method, comprising the steps of:
   - (a.) forming a plurality of metal lines separated by lateral spaces;
   - (b.) forming a first, substantially conformal, thin dielectric layer over ones of said metal lines;
   - (c.) filling said lateral spaces between said metal lines with a second dielectric comprising uncured hydrogen silsequioxane;
   - (d.) forming a third dielectric layer over said second dielectric and said plurality of metal lines, wherein said second dielectric has a high removal rate with respect to said first and third dielectrics;

(e.) patterning and etching slots in said third dielectric layer to expose portions of said second dielectric;

(f.) selective etching said second dielectric to substantially remove said second dielectric from said lateral spaces; and (g.) forming a fourth dielectric layer over said third dielectric layer, wherein said fourth dielectric does not fill said lateral spaces;

whereby capacitive coupling between ones of said metal lines is reduced.

7. The method of claim 6, wherein said first and said third dielectric comprise plasma-enhanced tetraethylorthosilicate-derived silicon dioxide.

8. The method of claim 6, further comprising the step, after step (c.) of:

(c1.) selectively removing any of said second dielectric which forms over said metal lines.

9. The method of claim 6, further comprising the step of:

(h.) forming a further plurality of metal lines on said fourth dielectric.

* * * * *